(12) United States Patent
Seifu et al.

(10) Patent No.: US 7,511,565 B2
(45) Date of Patent: Mar. 31, 2009

(54) INTEGRATED CIRCUIT APPARATUS AND METHOD OF COMPENSATING A CURRENT

(75) Inventors: Fesseha Tessera Seifu, London (GB); Marco Fornasari, Colchester (GB); Samir Aboulhouda, Ipswich (GB)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 133 days.

(21) Appl. No.: 11/455,376

(22) Filed: Jun. 19, 2006

(65) Prior Publication Data
US 2007/0024262 A1 Feb. 1, 2007

(30) Foreign Application Priority Data
Jul. 7, 2005 (GB) .................. 0513960.5

(51) Int. Cl.
*G05F 1/10* (2006.01)
*H03F 3/45* (2006.01)

(52) U.S. Cl. .................. 327/538; 327/89; 327/560; 323/316; 330/102; 330/259

(58) Field of Classification Search ................ None
See application file for complete search history.

(56) References Cited

U.S. PATENT DOCUMENTS 4,614,916 A    9/1986  Rinderle
6,452,422 B1   9/2002  Suzuki
6,529,077 B1 * 3/2003  Dasgupta .................. 330/254
6,617,888 B2 * 9/2003  Volk ........................... 327/67
7,064,602 B2 * 6/2006  Nguyen ..................... 327/541
7,312,643 B2  12/2007  Yanagihara

FOREIGN PATENT DOCUMENTS

DE         19639034         4/1998

\* cited by examiner

*Primary Examiner*—Lincoln Donovan
*Assistant Examiner*—Terry L Englund

(57) ABSTRACT

An integrated circuit comprises a gain stage circuit coupled to a compensation circuit. Both the gain stage circuit and the compensation circuit respectively comprise a first current source and a second current source that are subject to the same process variations. A negative feedback circuit is used to generate a corrective current in relation to the second current source, indicative of a current that needs to flow through a load in addition to a current flowing through the second current source in order for a variable voltage to be substantially equal to a reference voltage used to drive the first and second current sources. A compensating current corresponding to the corrective current generated for the second current source is applied to the first current source to compensate for process variation in the gain stage circuit in respect to the first current source.

8 Claims, 1 Drawing Sheet

INTEGRATED CIRCUIT APPARATUS AND METHOD OF COMPENSATING A CURRENT

Figure 1:
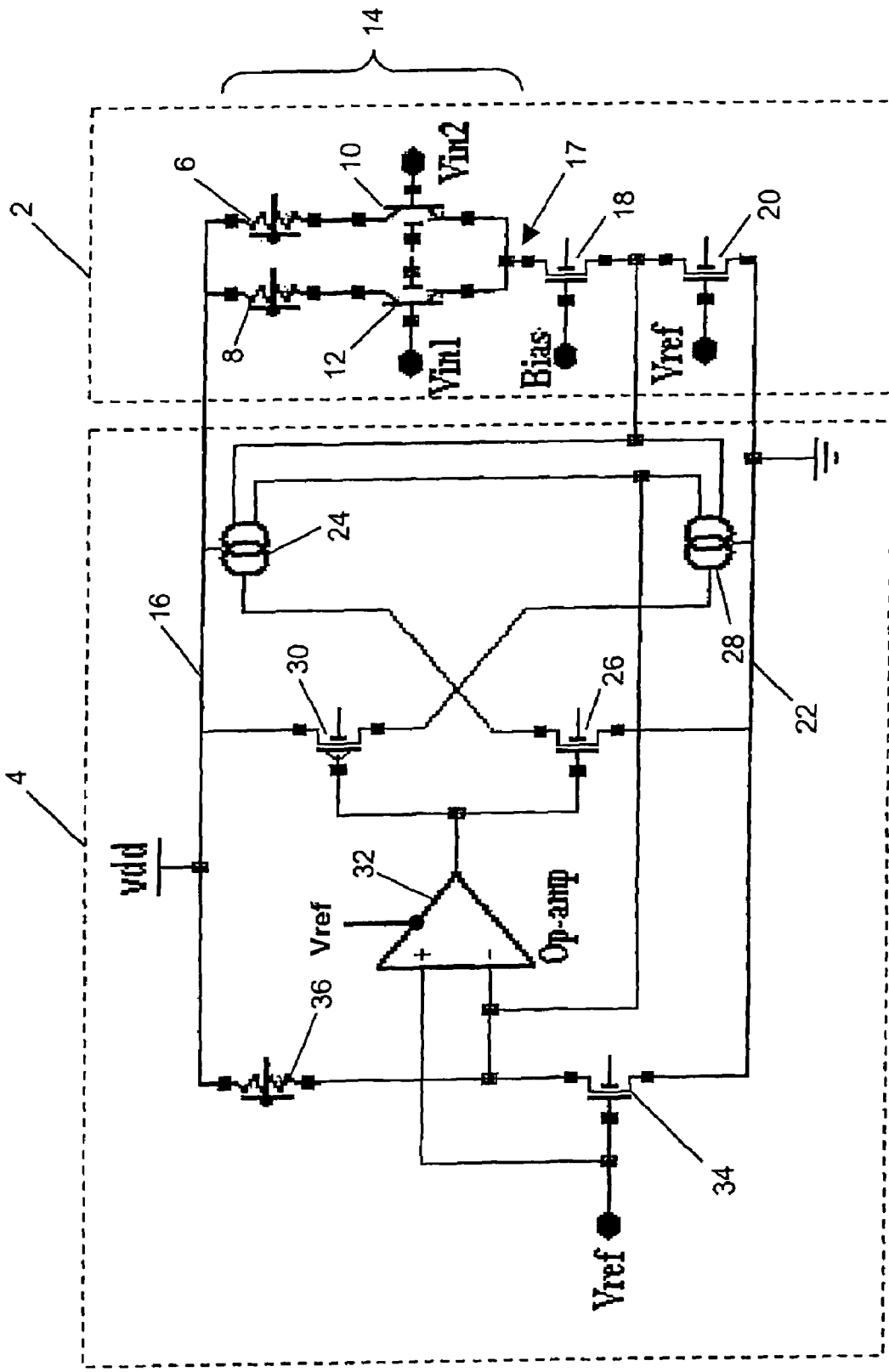

The present invention relates to an integrated circuit apparatus of the type, for example, comprising a compensation circuit to compensate for process variations in current sources. The present invention also relates to a method of compensating a current of the type, for example, flowing through a current source subject to process variations.

In the field of optical equalisation, it is currently desirable to develop Integrated Circuits (ICs) to extend electrically the optical transmission distance achievable at 10 Gb/s over multi-mode fibre. A short-term goal is to achieve lossless data transmission at 10 Gb/s over 300 metres of multi-mode grade fibre. Currently, an equalizer architecture sufficiently robust to achieve the 300 metres of lossless transmission consistently is not available. Work is thus underway in a number of companies to improve the equalizer algorithms and their implementations in silicon and software to achieve this 300 metre goal.

In this respect, a post-amplifier Automatic Gain Control (AGC) circuit is employed as part of an integrated circuit to perform the above-described optical equilisation. The integrated circuit is, of course reproduced a large number of times on a semiconductor wafer, but due to the nature of semiconductor processing techniques, a given semiconductor device in one instance of the integrated circuit may operate differently to a corresponding semiconductor device in another instance of the integrated circuit. Such inconsistencies are known as process variations. Indeed, variations are also likely to exist between current sources formed on different semiconductor wafers.

In analogue integrated circuits, process variations are difficult to control, resulting in the circuit performance differences that can result affecting the fabrication yield of a manufacturing process for the integrated circuits.

According to a first aspect of the present invention, there is provided an integrated circuit apparatus, the apparatus comprising: a first integrated circuit comprising a first current source requiring compensation; and a compensation circuit comprising: a feedback control loop arranged, when in use, to receive a variable voltage and a reference voltage and generate a corrective current in response to a difference between the variable voltage and the reference voltage; a voltage generation circuit comprising a second current source and arranged, when in use, to receive the corrective current and combine the corrective current with a current flowing through the second current source in order to generate the variable voltage, the variable voltage being substantially equal to the reference voltage when the current flowing through the second current source is in accordance with at least one design expectation of the second current source; wherein the second current source is the same as the first current source, the first and second current sources having been formed by substantially common process parameters; and the first current source is coupled to the compensation circuit in order to receive a compensation current corresponding to the corrective current.

The process parameters for the first current source may be exactly the same as process parameters for the second current source.

The voltage generation circuit may be arranged to generate, when in use, the variable voltage so as to be substantially the same as the reference voltage in the absence of the corrective current.

The first and second current sources may be biased by the reference voltage.

The first and second current sources may each comprise a common structure.

The first and second current sources may each comprise at least one semiconductor device, the at least one semiconductor device of the first current source respectively having a same structure as the at least one semiconductor device of the second current source.

The voltage generation circuit may comprise a load, the load being coupled to the second current source so that a voltage drop, when in use, across the load results in the generation of the variable voltage.

The compensation circuit may comprise a current mirror arrangement to generate the compensation current in response to the corrective current.

The current mirror arrangement may comprise a pair of current mirrors.

The feedback control loop may comprise a voltage to current converter circuit arranged to generate the corrective current. The compensation circuit may comprise an operational amplifier. The operational amplifier may comprise an output coupled to an input of the voltage to current converter.

The voltage to current converter circuit may comprise a pair of transistors of opposite type, control terminals of the pair of transistors being coupled together.

The pair of transistors may be cross-coupled to the pair of current mirrors.

The first current source may be coupled to a cascode transistor.

According to a second aspect of the present invention, there is provided a method of compensating a current flowing through a first current source, the method comprising the steps of: generating a variable voltage using a current flowing through a second current source in combination with a corrective current, the second current source being the same as the first current source and so formed by substantially common process parameters; generating the corrective current in response to a difference between the variable voltage and a reference voltage; providing a compensation current to the first current source, the compensation current corresponding to the corrective current; wherein the variable voltage is substantially equal to the reference voltage when the current flowing through the second current source is in accordance with at least one design expectation of the second current source.

It is thus possible to provide an integrated circuit apparatus and a method of compensating a current that obviates the effects of process variations in current sources between integrated circuits, thereby increasing integrated circuit fabrication yields. The above method and apparatus also obviates, or at least mitigates, the effects of temperature variations in relation to current sources in integrated circuits.

At least one embodiment of the invention will now be described, by way of example only, with reference to the accompanying FIG. 1, which is a schematic diagram of an integrated circuit constituting an embodiment of the invention.

Throughout the following description identical reference numerals will be used to identify like parts.

Referring to FIG. 1, a post-amplifier (not shown) for Automatic Gain Control (AGC) purposes in an equaliser circuit (also not shown) comprises a gain stage circuit 2 coupled to a compensation circuit 4. The gain stage circuit 2 comprises a first resistor 6, a second resistor 8, a first npn bipolar transistor 10, and a second npn bipolar transistor 12 coupled together to form a so-called "differential pair" circuit configuration 14, the first and second resistors 6, 8 being coupled to a positive voltage supply rail 16 held at a potential of Vdd.

A tall 17 of the differential pair circuit configuration 14 is coupled to a drain terminal of a first, N-channel Metal Oxide Semiconductor (NMOS), transistor 18, the first NMOS transistor 18 constituting a cascode transistor. A gate terminal of the cascode transistor 18 is coupled to a bias voltage source (not shown) and a source terminal of the cascode transistor 18 is coupled to a drain terminal of a first current source 20. In this example, the first current source 20 is a second NMOS transistor. A source terminal of the first current source 20 is coupled to ground rail 22, the cascode transistor 18 serving to isolate the first current source 20 from the differential pair circuit configuration 14.

Although, in this example, the current source 20 is a single NMOS transistor, the skilled person will appreciate that other circuit configurations and devices can be employed as the current source 20. In any event, performance of the current source 20 is subject to process variations typical of semiconductor fabrication processes and so in order to ensure consistent performance between different instances of the gain stage circuit 4 formed, the compensation circuit 4 is coupled to the gain stage circuit 2.

In this respect, the compensation circuit 4 comprises a first current mirror 24 coupled to the positive voltage supply rail 16, an input terminal of the first current mirror 24 being coupled to a drain terminal of a third NMOS transistor 25. A source terminal of the third NMOS transistor 26 is coupled to the ground rail 22. A first output terminal and a second output terminal of the first current mirror 24 are respectively coupled to a first output terminal and a second output terminal of a second current mirror 28, the second output terminal of the first and second current mirrors 24, 28 being coupled to the source terminal of the cascade transistor 18 and hence the drain terminal of the first current source 20. The second current mirror 28 is also coupled to a drain terminal of a first P-channel Metal Oxide Semiconductor (PMOS) transistor 30. A source terminal of the first PMOS transistor 30 is coupled to the positive supply rail 16.

Respective gate terminals of the third NMOS and first PMOS transistors 26, 30 are coupled together, the third NMOS and the first PMOS transistors 26, 30 constituting a voltage to current converter circuit. The gate terminals of the third NMOS and first PMOS transistors 26, 30 are coupled to an output terminal of an operational amplifier 32, the operational amplifier 32 having a non-inverting input coupled to a source of a reference voltage (not shown). An inverting input terminal of the operational amplifier 32 is coupled to the first outputs of the first and second current mirrors 24, 28 as well as a drain terminal of a fourth, NMOS, transistor 34 and a first terminal of a load 36, for example a resistor; the second terminal of the load 36 is coupled to the positive rail 16. However, it should be appreciated that the load 36 can alternatively be coupled to a bandgap reference voltage source to avoid dependency on variations in the supply voltage.

A gate terminal of the fourth NMOS transistor 34 is also coupled to the source of the reference voltage (not shown), and the source terminal of the fourth NMOS transistor 34 is coupled to the ground rail 22.

In order to couple the compensation circuit 4 to the gain stage circuit 2, the second outputs of the first and second current mirrors 24, 28 are coupled to the source terminal of the cascade transistor 18 and the drain terminal of the current source 20. For completeness, it should be understood that the cascade transistor 18 and the current source 20 form part of a third, cascoded, current mirror circuit (not shown).

In operation, normal operation of the differential pair circuit configuration 14 operates in accordance with a known operational behaviour of a differential pair circuit and so, for the sake of conciseness and clarity of description, the operation of the differential pair circuit configuration 14 will not be described further herein other than to point out that the first current source 20 supplies current to the differential pair circuit configuration 14.

An exact value of a first current flowing through the first current source 20 depends upon process parameters associated with the fabrication of the integrated circuit that is the gain stage circuit 2. In this respect, one or more process parameters can vary, for example, between semiconductor wafers fabricated and containing respective instances of the integrated circuit. Consequently, the compensation circuit 4 serves to mitigate against variances in the first current flowing through the current source 20 as a result of such process variations.

The compensation circuit 4 makes use of negative feedback to control variation of the first current source 20 with process as well as, in this example, temperature variation.

The gate terminal of the fourth NMOS transistor 34 is driven by the reference voltage, Vref. In this example, the source of the reference voltage, Vref, is a band-gap reference circuit that generates the reference voltage, Vref, so as to be constant over temperature. Alternatively, a Proportional To Absolute Temperature (PTAT) reference circuit or a Complementary To Absolute Temperature (CTAT) reference circuit can be employed. As a result of driving the fourth NMOS transistor 34 with the reference voltage, Vref, a second current is generated by the fourth NMOS transistor 34, contributing to a variable voltage applied at the inverting input terminal of the operational amplifier 32 as a result of a variable current flowing through the load 36, the variable current comprising the second current and a corrective current.

The load 36 is selected as part of the design process so that the variable voltage applied is substantially equal to the reference voltage, assuming the second current flowing through the fourth NMOS transistor is not caused to vary from that expected as a result of the design process due to process variations. This is achieved by initially disconnecting the first outputs of the first and second current mirrors 24, 28 from the inverting input terminal of the operational amplifier 32 during the design process of the circuit. Once the variable voltage applied at the inverting input terminal is, through any calibration performed during the design process, approximately equal to the reference voltage the first outputs of the first and second current mirrors 24, 28 are re-connected to the inverting input terminal of the operational amplifier 32 in the actual circuit used, thereby applying negative feedback to the inverting input terminal of the operational amplifier 32.

In this respect, the operational amplifier 32 generates an output voltage proportional to a difference between the reference voltage, Vref, and the variable voltage. The third NMOS and the first PMOS transistors 26, 30 serve to convert the output voltage at the output terminal of the operational amplifier 32 to the incremental and decremental currents (depending upon the value of the output voltage) to compensate for the variation of the fourth NMOS transistor/second current source 34 with the process. Consequently, currents generated by the third NMOS and the first PMOS transistors 26, 30 are summed, by virtue of the first outputs of the first and second current mirrors 24, 28 being coupled together, and fed back to the inverting input terminal of the operational amplifier 32. The current fed back is the corrective current.

As a result of calibration during the design process, in an ideal state no process variation exists and the summed current fed back from the first and second current mirrors will be close to zero. However, when the fourth NMOS transistor 34 is subject to a process variation, the variable voltage generated at the inverting input terminal of the operational amplifier 32 will vary from the reference voltage, Vref, resulting in the generation of the corrective by the operational amplifier 32 in combination with the voltage to current converter circuit and the first and second current mirrors 24, 28. The corrective current is generated in order to try to minimise the difference between the reference voltage and the variable voltage by increasing or decreasing the corrective current fed back from the first and second current mirrors 24, 28. The increase or decrease in the corrective current depends on whether the reference voltage is greater or less than the variable voltage.

The corrective current generated is the current needed to compensate for the process variation in the third NMOS transistor/second current source 34. Since the second current source 34 is the same as the first current source 20, the current generated by the third NMOS and first PMOS transistor 26, 30 are duplicated by the first and second current mirrors 24, 28 and then summed by virtue of the second outputs of the first and second current mirrors 24, 28 being coupled together, the copy of the corrective current generated by the third NMOS and first PMOS transistor 26, 30 constituting a compensation current that is applied between the cascode transistor 18 and the first current source 20.

Consequently, since the first and second current sources 20, 34 are the same and are biased by the same reference voltage, Vref, then the corrective current used in relation to the second current source 34 yields a same compensatory effect in relation to the first current source 20, thereby resulting in a so-called "tail current" supplied through first and second bipolar transistors 10, 12 comprising a compensation for process variation.

The invention claimed is:

1. An integrated circuit apparatus, the apparatus comprising:
   a first integrated circuit comprising a first current source requiring compensation; and
   a compensation circuit comprising:
      a feedback control loop arranged, when in use, to receive a variable voltage and a reference voltage and generate a corrective current in response to a difference between the variable voltage and the reference voltage;
      a voltage generation circuit comprising a second current source and arranged, when in use, to receive the corrective current and combine the corrective current with a current flowing through the second current source in order to generate the variable voltage, the variable voltage being substantially equal to the reference voltage when the current flowing through the second current source is in accordance with at least one design expectation of the second current source; wherein
      the second current source is the same as the first current source, the first and second current sources having been formed by substantially common process parameters; and
      the first current source is coupled to the compensation circuit in order to receive a compensation current corresponding to the corrective current.

2. An apparatus as claimed in claim 1, wherein the first and second current sources are biased by the reference voltage.

3. An apparatus as claimed in claim 1, wherein the first and second current sources each comprise a common structure.

4. An apparatus as claimed in claim 1, wherein the first and second current sources each comprises at least one semiconductor device, the at least one semiconductor device of the first current source respectively having a same structure as the at least one semiconductor device of the second current source.

5. An apparatus as claimed in claim 1, wherein the voltage generation circuit further comprises a load, the load being coupled to the second current source so that a voltage drop, when in use, across the load results in the generation of the variable voltage.

6. An apparatus as claimed in claim 1, wherein the feedback control loop comprises a voltage to current converter circuit arranged to generate the corrective current.

7. An apparatus as claimed in claim 6, wherein the voltage to current converter circuit comprises a pair of transistors of opposite type, with control terminals of the pair of transistors being coupled together.

8. An apparatus as claimed in claim 1, wherein the first current source is coupled to a cascode transistor.

\* \* \* \* \*